United States Patent [19]

Groh

[11] 4,196,775
[45] Apr. 8, 1980

[54] SHOCK-MOUNTED, LIQUID COOLED COLD PLATE ASSEMBLY

[75] Inventor: Leon H. Groh, Los Gatos, Calif.

[73] Assignee: The Unites States of America as represented by the Secretary of the Navy, Washington, D.C.

[21] Appl. No.: 834,739

[22] Filed: Sep. 19, 1977

[51] Int. Cl.² .......................... F28F 3/12; F16F 15/00
[52] U.S. Cl. ...................................... 165/68; 165/69; 165/168; 248/616; 357/82; 165/80 C
[58] Field of Search .................... 165/47, 68, 69, 80, 165/168, 180, 80 C; 248/22, 15, 616; 357/82

[56] References Cited
U.S. PATENT DOCUMENTS

| 2,538,658 | 1/1951 | Saurer | 248/22 |
| 2,663,551 | 12/1953 | Boling | 165/68 |
| 3,079,132 | 2/1963 | Tiegel | 165/69 X |
| 3,361,195 | 1/1968 | Meyerhoff et al. | 357/82 X |
| 3,706,343 | 12/1972 | Saiga et al. | 165/180 X |
| 4,079,410 | 3/1978 | Schierz | 165/80 |

Primary Examiner—Richard E. Gluck
Attorney, Agent, or Firm—R. S. Sciascia; Charles D. B. Curry; Francis I. Gray

[57] ABSTRACT

A shock-mounted, liquid cooled cold plate assembly for dissipating heat from electronic packages mounted on it. A U-shaped cold plate is cast about a tube to provide a passageway for carrying a turbulent flow of coolant along its length. The cold plate is mounted on a vehicle frame by shock-mounted isolator studs which are encapsulated in an elastomer and contained in a housing secured to the frame. An electronic package is mounted on the cold plate by a flange on the package which makes intimate contact with the surface of the cold plate for maximum heat transfer capability.

6 Claims, 4 Drawing Figures

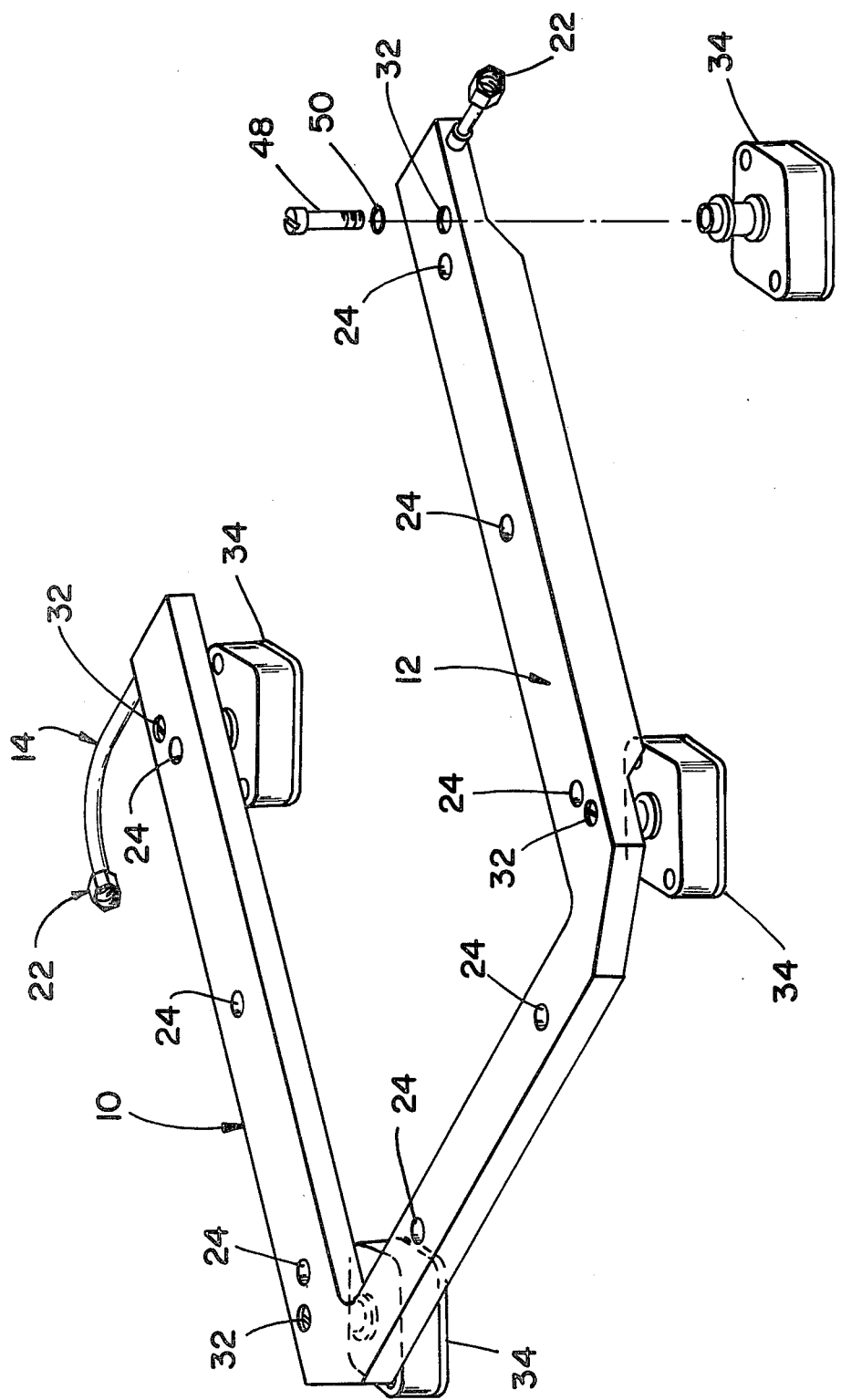
FIG_1

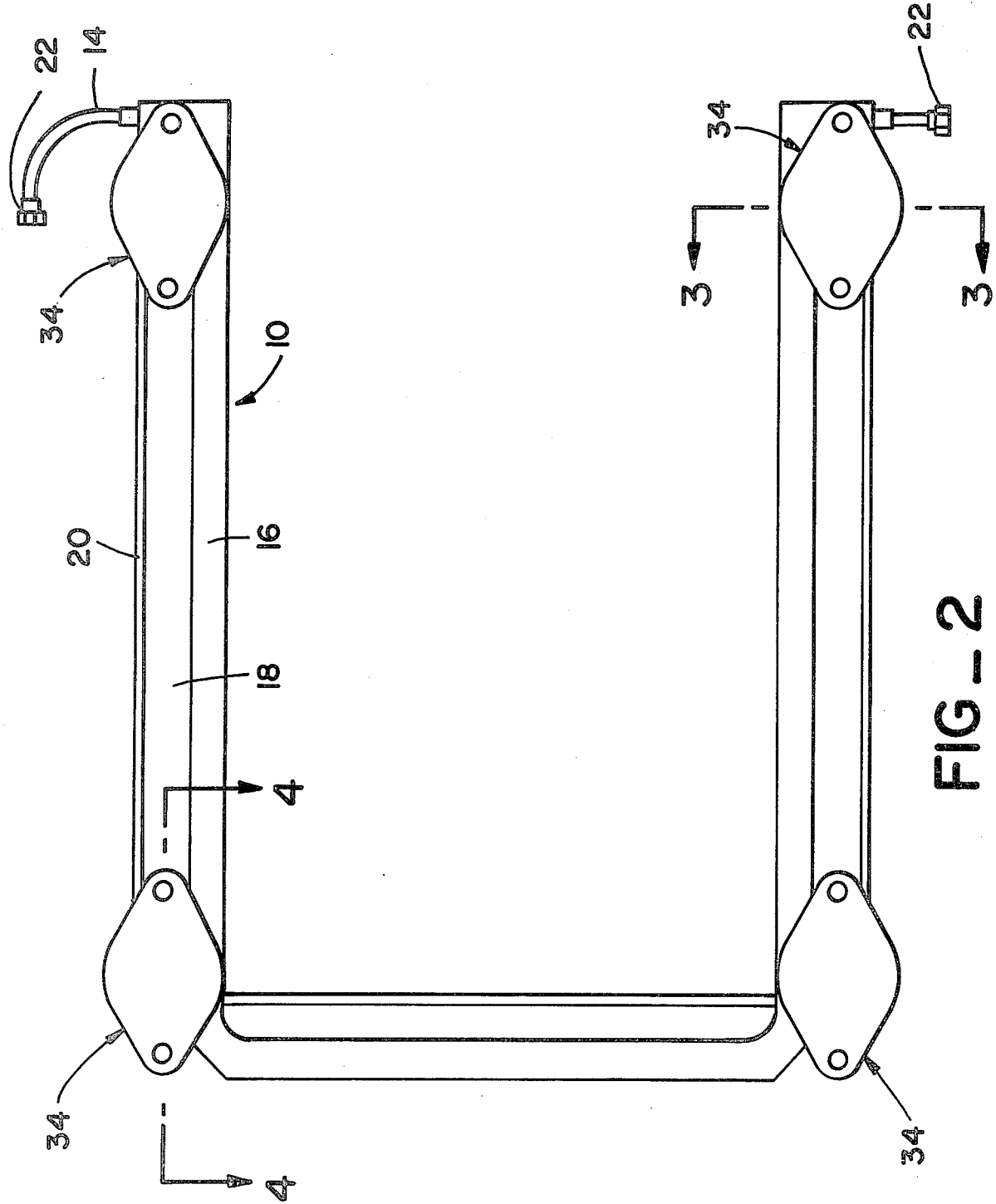
FIG_2

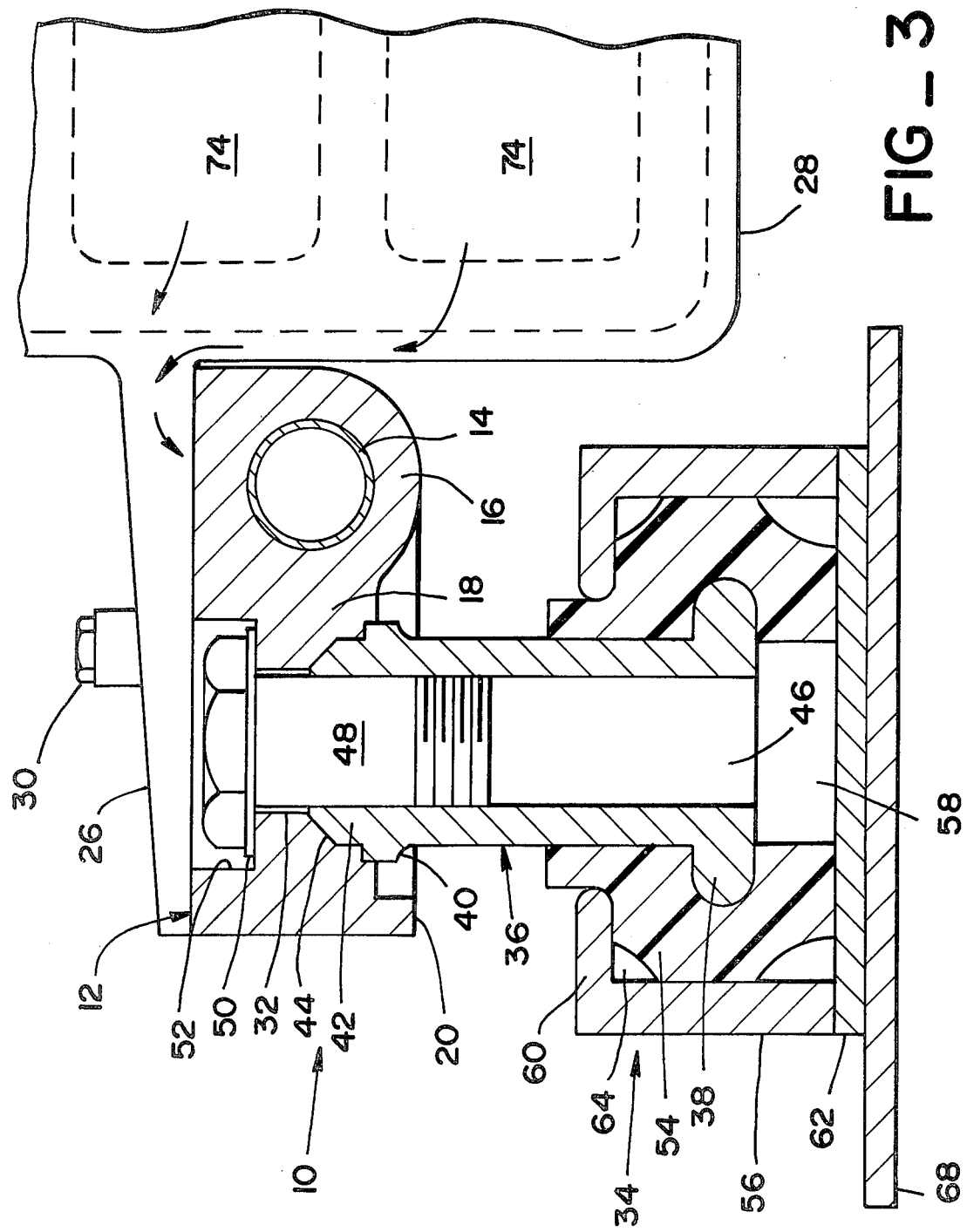
FIG_3

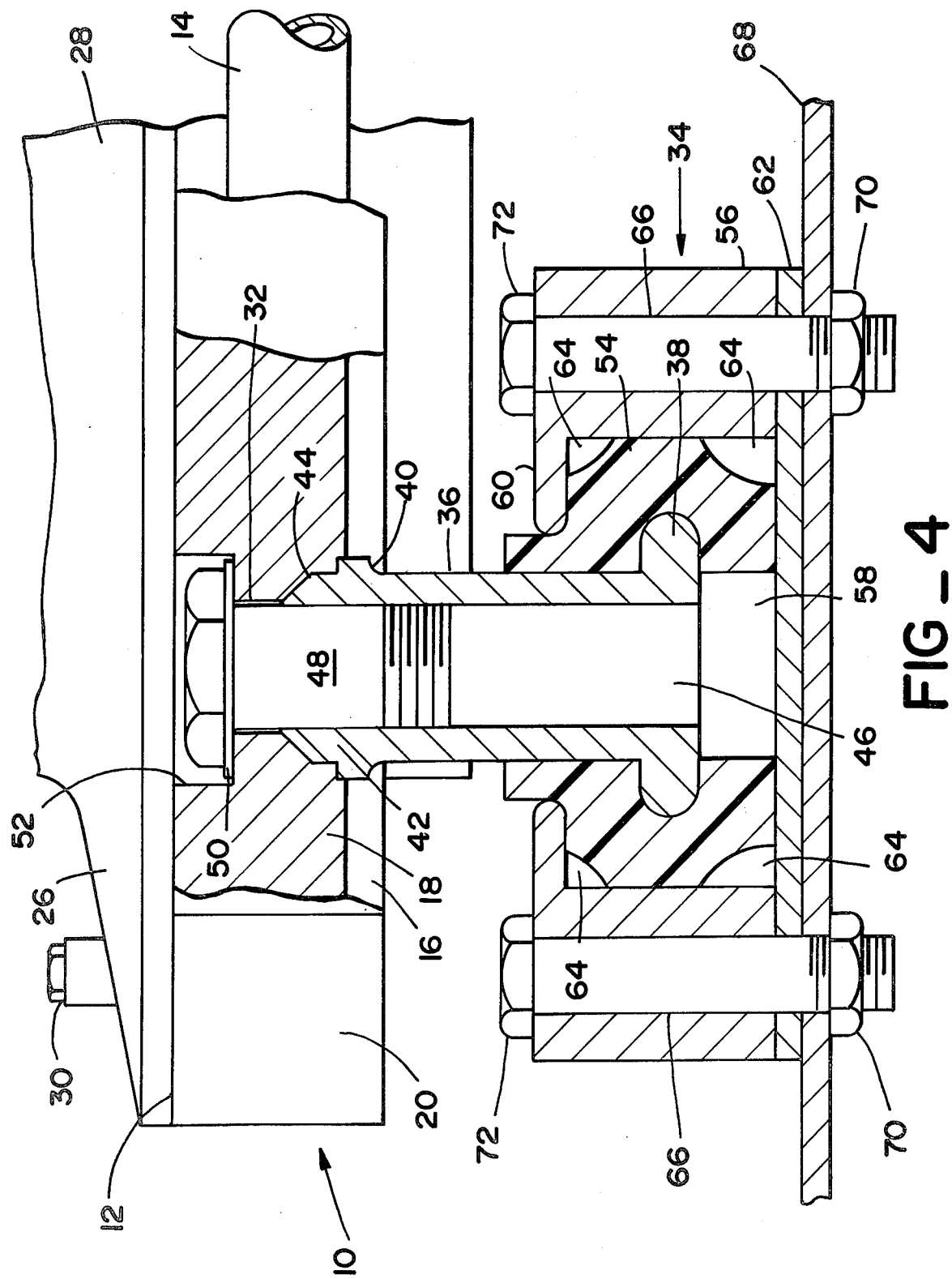
FIG_4

SHOCK-MOUNTED, LIQUID COOLED COLD PLATE ASSEMBLY

BACKGROUND OF THE INVENTION

1. Field of the Invention

The present invention relates to heat dissipation systems, and more particularly to shock-mounted, liquid cooled cold plate assemblies.

2. Description of the Prior Art

Prior liquid cooled electronic packages for aerospace applications generally have coolant lines within the package chassis which are connected to an aerospace vehicle coolant system by quick disconnects. Vibration isolators are generally mounted external to the electronics package to connect the package chassis to the vehicle structure.

Whenever the electronic package is removed care must be taken to clear the coolant lines. When the package is removed from the vehicle, the inlet and outlet quick disconnects, being of a self-sealing type, seal to trap coolant in the lines inside the package. If the temperature of the package during storage, shipment or environmental testing causes the entrapped coolant, generally water, to freeze, the coolant lines will burst or deform, requiring rebuilding of the package. Furthermore, the use of the quick disconnects limits the coolant system pressure to avoid the possibility of coolant leaks. Although each half of the quick disconnects is supposed to seal without coolant spillage when disconnected, i.e., when the electronic package is removed from the vehicle, spillage of coolant sometimes occurs within the vehicle. Leaky seals also can cause spillage within the vehicle. Therefore, it is desirable to eliminate the quick disconnects which are potential leakage points while maintaining the ability to readily remove the electronic package and to eliminate vibration.

SUMMARY OF THE INVENTION

Accordingly, the present invention provides a shock-mounted, liquid cooled cold plate assembly which is mounted on an aerospace vehicle frame and on which electronic packages may be mounted to effectively dissipate heat. A U-shaped cold plate is cast around a thin-walled heat conductive tube which provides a passageway for coolant along the length of the cold plate. The cold plate is attached to a plurality of isolator studs which each have a head encased in an elastomer. The elastomer-encased head is retained in a housing which is securly fastened to an aerospace vehicle frame. The flange of an electronics package is then secured in intimate contact with the surface of the cold plate to effectively dissipate heat from the electronics package.

Therefore, it is an object of the present invention to provide a shock-mounted, liquid cooled cold plate assembly to dissipate heat from an electronics package mounted thereon.

Another object of the present invention is to provide a shock-mounted, liquid cooled cold plate assembly which eliminates potential leakage points.

A further object of the present invention is to provide a shock-mounted, liquid cooled cold plate assembly which can operate at higher coolant pressures without the possibility of leaking.

Still another object of the present invention is to provide a shock-mounted, liquid cooled cold plate assembly which allows an electronic package to be readily removed without disturbing the coolant system.

Other objects, advantages and novel features of the present invention will become apparent from the following detailed description when read in view of the claims and accompanying drawing.

BRIEF DESCRIPTION OF THE DRAWING

FIG. 1 is a perspective view of a shock-mounted, liquid cooled cold plate assembly according to the present invention.

FIG. 2 is a bottom plan view of a shock-mounted, liquid cooled cold plate assembly according to the present invention.

FIG. 3 is a cross-sectional view of the shock-mounted, liquid cooled cold plate assembly of FIG. 2 taken along line 3—3.

FIG. 4 is a cross-sectional view of the shock-mounted, liquid cooled cold plate assembly of FIG. 2 taken along line 4—4.

DESCRIPTION OF THE PREFERRED EMBODIMENT

Referring now to the Figures of the drawing, a U-shaped cold plate 10 of a material such as aluminum which is a good heat conductor has an upper surface 12 which is machined to be as smooth as possible, such as a 63 rms surface finish and a flatness tolerance of 0.005. The cold plate 10 is cast around a thin tube 14 having a wall thickness of approximately 0.012", for example, to produce an approximate U-shaped cross-section with a thick leg 16 enclosing the tube, a thick central portion 18 and a flange 20. The tube 14 is of a heat conducting material, such as stainless steel which is compatible with other cooling system materials to minimize coolant contamination and corrosion between dissimilar materials. The tube material has a higher melting point than that of the material of the cold plate 10 to produce an intimate thermal contact between the cold plate and the tube as a result of the casting process. The ends of the tube 14 extend outside the cold plate 10 and terminate in connectors 22 which connect the tube to a flexible section of the liquid cooling system (not shown) such as is found on an aerospace vehicle to provide for relative motion between the cold plate and vehicle structure during flight. A plurality of screw holes 24 are located in the central portion 18 of the upper surface 12 by which means the flange 26 of an electronic package 28 can be secured by bolts 30 to the cold plate 10 to provide intimate thermal contact between the cold plate and the electronic package, although any other means may be used to mount the electronic package on the cold plate which will provide the intimate thermal contact. A plurality of holes 32 provide means for attaching isolator assemblies 34 to the underside of the cold plate 10.

Each isolator assembly 34 has an isolator stud 36 with a large diameter head 38 which forms one end and a flange 40 near the other end 42. The flange 40 is in the form of a circle with parallel truncated edges which prevent the stud 36 from turning as it is attached to the cold plate 10. The end 42 is tapered to form a frusto-conical shape which fits snugly into a similarly shaped lower portion 44 of hole 32. A central threaded hole 46 exists in the stud 36 so that a bolt 48 and washer 50 can securely fasten the stud to the cold plate 12 through hole 32. A larger diameter upper portion 52 of hole 32 provides a recess so that the head of the bolt 48 does not protrude above the upper surface 12 of the cold plate 10 to interfere with the thermal interface between the cold plate and the electronic package 28. An elastomer 54, such as long life silicone rubber or like material which deforms when subjected to compressional forces and which will withstand severe environments, is molded about the head 38 of the isolator stud 36. The elastomer-encased head 38 is retained by a housing 56 having a cylindrical cavity 58 and an inwardly projecting flange 60 so that one opening to the cavity is larger in diameter than the body of the stud 36, but smaller in diameter than the head 38. Thus, the stud 36 will be retained by the housing 56 even if there is complete degradation of the elastomer 54. A retainer 62 is bonded by suitable means to the housing 56 to enclose the elastomer-encased head 38 snugly in the cavity 58 with the body of the stud 36 and part of the elastomer 54 protruding through the opening formed by the housing flange 60. The flange 60 has a rounded lip so as not to abrade the elastomer 54 as does the stud head 38. Deformation spaces 64 are provided within the cavity 58 by the shape of the molded elastomer 54 so the elastomer can flow when subjected to shock, and so that the normal contact area between the elastomer and the cavity wall in the vertical and horizontal directions is approximately equal, making the spring constant approximately equal in any direction. One or more holes 66 are provided through the housing 56 and retainer 62 so that the isolator assembly 34 may be secured to a vehicle frame 68 by suitable means such as nuts 70 and bolts 72. The housing 56 and retainer 62 may be made of a light metal such as aluminum, while the stud may be made of a strong material such as steel. Also, the central section 18 of the cold plate 10 can be made thinner to reduce weight except in the areas where holes 24 are located. The shape of the cold plate 10 may be other than U-shaped depending upon the configuration of the electronic package 28 to be cooled.

In operaton the electronic package 28 is secured to the cold plate 10 providing metal to metal contact between the upper contact surface 12 and equipment package flange 26. Heat from heat sources 74 within the electronic package 28 flows through the walls to the flange 26 and thence to the cold plate 10. A liquid coolant, such as deionized distilled water to eliminate corrosion, is circulated through the tube 14 to carry the heat away from the cold plate 10. The flow rate of the coolant is such as to cause turbulent flow, for laminar flow would result in a temperature differential between the center of the coolant mass and the surface of the coolant mass at the inner surface of tube 14. For a fixed flow rate the dimensions of the thin tube 14 are selected to provide the desired turbulent flow. The turbulent flow mixes the coolant and reduces this temperature differential, producing more effective heat transfer from the cold plate 10 through the wall of the tube 14 to the coolant. The machined interface between the package flange 26 and the contact surface 12, and the casting of the cold plate 10 around the tube 14 together with the turbulent coolant flow produces optimum heat transfer from the electronic package 28 to the coolant. For example, for heat dissipation of 245 watts a flow rate of one gallon per minute of water at 70° F. in a 0.23" I.D. tube results in less than a 2° F. temperature rise in the water from entrance to exit of the cold plate 12. Additionally, vibrations caused by motion of the aerospace vehicle and transmitted through the frame 68 are attenuated by the compression of the elastomer 54 in response to the vibration shocks in both vertical and lateral directions.

Thus, the present invention eliminates the need for quick disconnects with associated O-rings and also reduces the number of coolant line connections to effectively eliminate the possibility of coolant leakage and permit higher coolant working pressure due to the metal to metal seals. Also, the design of the electronic package to be cooled is simplified by eliminating internal cooling lines as well as reducing the number of package openings to hostile environments and, since coolant does not flow through the package, tap water can be used to cool the cold plate during check-out without requiring purging of the coolant as in the prior art.

What is claimed is:

1. A shock-mounted, liquid cooled cold plate assembly for cooling a heat source having a mating flange comprising:
   (a) a thin-walled tube for carrying a liquid coolant, said thin-walled tube being of a heat conductive material;
   (b) a cold plate having a smooth surface configured to mate with said mating flange in intimate contact, said cold plate being of a heat conductive material having a lower melting point than the material of said thin-walled tube, and being cast around said thin-walled tube; and
   (c) a plurality of isolator assemblies attached to said cold plate to provide a means for mounting said cold plate on a frame while isolating said cold plate from vibrations transmitted by said frame, each of said isolator assemblies including:
   (i) a stud having a head, a body and a tip with a flange near said tip;
   (ii) an elastomer molded about said head and said body adjacent said head;
   (iii) a housing having a central cavity with an inwardly projecting flange to form one entrance to said cavity which allows said tip and a portion of said body to pass through;
   (iv) a retainer attached to said housing to form the back wall of said cavity and to enclose said head in said cavity such that said elastomer fits snugly against the walls of said cavity with deformation spaces into which said elastomer flows when subjected to shock; and
   (v) means for attaching said stud to said cold plate.

2. A shock-mounted, liquid cooled cold plate assembly as recited in claim 1 wherein said heat conductive material of said thin-walled tube is stainless steel.

3. A shock-mounted, liquid cooled cold plate assembly as recited in claim 2 wherein said heat conductive material of said cold plate is aluminum.

4. A shock-mounted, liquid cooled cold plate assembly as recited in claim 3 wherein said smooth surface is machined to a 63 rms surface finish and a 0.005 flatness tolerance.

5. A shock-mounted, liquid cooled cold plate assembly as recited in claim 4 further comprising means for attaching said thin-walled tube to an external liquid coolant system.

6. A shock-mounted, liquid cooled cold plate assembly as recited in claim 5 wherein the coolant of said liquid coolant system is deionized distilled water.

* * * * *